United States Patent [19]

Jambotkar

[11] Patent Number: 4,663,832

[45] Date of Patent: May 12, 1987

[54] METHOD FOR IMPROVING THE PLANARITY AND PASSIVATION IN A SEMICONDUCTOR ISOLATION TRENCH ARRANGEMENT

[75] Inventor: Chakrapani G. Jambotkar, Hopewell Junction, N.Y.

[73] Assignee: International Business Machines Corporation, Armonk, N.Y.

[21] Appl. No.: 626,280

[22] Filed: Jun. 29, 1984

[51] Int. Cl.$^4$ .................... H01L 21/302; H01L 21/76; H01L 21/306

[52] U.S. Cl. .............................. 29/576 W; 29/576 E; 29/576 B; 148/187; 156/643; 156/644; 357/50; 357/91

[58] Field of Search ................ 29/576 W, 576 E, 571, 29/576 B; 148/1.5, 187; 156/643, 644; 357/50, 91

[56] References Cited

U.S. PATENT DOCUMENTS

| | | | |
|---|---|---|---|
| 4,333,794 | 6/1982 | Beyer et al. | 156/648 |
| 4,271,583 | 6/1981 | Kahng et al. | 29/571 |
| 4,391,033 | 7/1983 | Shinozaki | 29/576 |
| 4,396,460 | 8/1983 | Tamaki et al. | 29/571 |
| 4,419,813 | 12/1983 | Iwai | 29/576 W |
| 4,443,933 | 4/1984 | De Brebisson | 29/578 |
| 4,466,180 | 8/1984 | Soclof | 29/576 B |
| 4,493,740 | 1/1985 | Komeda | 148/187 |
| 4,502,914 | 3/1985 | Trumpp et al. | 29/576 W |

FOREIGN PATENT DOCUMENTS

| | | | |
|---|---|---|---|
| 0060851 | 4/1982 | Japan | 29/576 W |
| 0153349 | 9/1983 | Japan | 29/576 W |

Primary Examiner—Upendra Roy
Attorney, Agent, or Firm—Wolmar J. Stoffel

[57] ABSTRACT

In a semiconductor substrate having a trench isolation pattern formed therein, a method is taught for improving the planarity of the substrate and for improving the silicon nitride passivation at the trench peripheries. The quality of the trench edge is improved by providing for an undercut silicon dioxide layer and a recessed silicon sidewall arrangement below the silicon nitride layers resulting in better protection of the underlying $SiO_2$ and Si regions. In further processing, improved planarity between the polyimide-filled trench and the adjacent substrate is achieved by establishing a polyimide etchback point via a previously deposited oxide layer. Subsequent removal of the oxide does not affect the polyimide; the top of said polyimide being substantially planar with the adjacent substrate.

10 Claims, 14 Drawing Figures

METHOD FOR IMPROVING THE PLANARITY AND PASSIVATION IN A SEMICONDUCTOR ISOLATION TRENCH ARRANGEMENT

BACKGROUND OF THE INVENTION

In the formation of high density integrated circuits, there is a need to isolate the components from one another in order to prevent undesired interactions. One means of achieving isolation, in the art, is to etch a series or pattern of isolation trenches in the semiconductor substrate, passivate them with oxide and nitride and then fill them with a dielectric material. When a dielectric material such as polyimide is used, the typical processing consists of finishing all high-temperature processing including formation of emitter contacts and emitter diffusion prior to the formation of the isolation trenches. In filling the trenches, the dielectric material is deposited over the entire patterned substrate so as to overfill the trenches. The dielectric material is then etched back to re-expose the substrate and contacts, leaving the trenches "full". In order, however, to guarantee exposure of the contacts, which are located in recesses in the substrate surface, the dielectric material is generally over-etched below the recess level, thus leaving a significant step at the trench peripheries. This topographical non-planarity has been found to create discontinuities in the subsequently formed metallization line patterns.

A further well-known difficulty with regard to the isolation trenches is in the continuous nitride passivation of the substrate, especially at the trench peripheries. In a typical process, the top substrate surface is passivated with the nitride before trench etching; the trench sidewalls are then passivated with a subsequent separate nitride deposition. As such, at the edge, the protection of the underlying commonly used oxide insulator is relatively poor. The result of the poor nitride passivation can include: silicon-tometal shorts near the top edge of the trenches as a consequence of accidental removal of the oxide insulator in a cleaning or etching step that follows; or contamination of the insulating layer with, for example, sodium from a subsequently deposited quartz layer.

SUMMARY OF THE INVENTION

It is therefore an objective of the present invention to provide an improved isolation trench scheme and method for making same.

It is another objective of the invention to provide a unique isolation trench configuration having improved insulation and passivation characteristics.

It is still another objective of the invention to provide an undercut insulating layer at the top of an isolation trench, and an overlying passivation layer at the top of and coating all of the trench in order to avoid the effects of poor passivation.

It is a further objective of the invention to provide a high degree of planarity in an isolation trench/substrate structure.

Finally, it is an objective of the invention to provide for a polyimide etchback end-detection point which is above the level of recessed substrate contacts and above the level of the upper substrate surface allowing for a planar surface along the polyimide filled trenches and the substrate.

These and other objectives are accomplished by the subject invention which provides, in a silicon substrate having an etched isolation trench pattern, for an undercut silicon dioxide insulation layer and a recessed silicon sidewall arrangement below protective layers of silicon nitride at the trench peripheries. The invention further teaches the establishment, through previously deposited layers, of a polyimide etchback end detection point, above the level of the recessed contacts in the silicon substrate, in order to attain a higher degree of planarity between the polyimide filling and the upper substrate surface.

DETAILED DESCRIPTION OF THE PREFERRED EMBODIMENT

Figure 1:
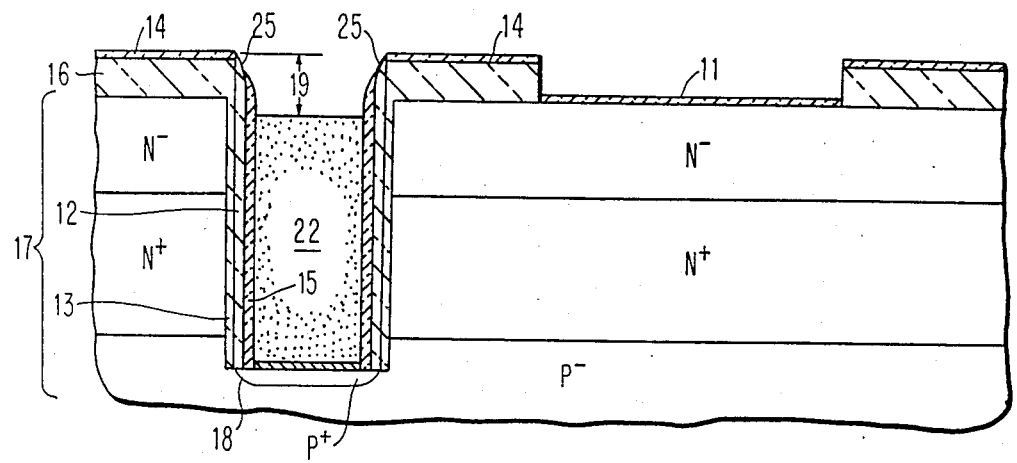
FIG. 1 is a cross-sectional view of a semiconductor substrate structure produced in accordance with well-known fabrication processes.

The problems to be rectified by the subject invention are illustrated in FIG. 1. In a typical process successive layers of silicon dioxide 16 and silicon nitride 14 are deposited on a silicon substrate having an integrated circuit structure formed therein. A pattern of isolation trenches, is then etched into the substrate using an appropriate mask. The trench next undergoes an oxidation step (i.e. is exposed to an oxidizing atmosphere) to form a layer, 13, of silicon dioxide; this is followed by successive chemical vapor deposition of another layer 12 of silicon dioxide and, a passivation layer of silicon nitride, 15, in the trench 18. The nitride layer, 15, and oxide layers 12 and 13 are next successively subjected to vertically directional reactive ion etching. At the end of this reactive ion etching, a discontinuity exists between the nitride layers, 14 and 15, at the trench edges, 25. The first problem, to which this invention directs itself, arises as a result of this discontinuity of the silicon nitride layers 14 and 15. This discontinuity can expose the underlying oxide layers to contamination or even accidental removal of the oxide in subsequent cleaning processes, resulting in difficulties during device operation such as leakage and/or shorting through the contaminated or missing layers.

The second problem to be resolved arises after the "passivated" trench is filled with the dielectric material, such as polyimide. The polyimide, 22 in FIG. 1, is deposited in sufficient quantity to overfill the trench 18; this leaves an excess layer of polyimide on the substrate surface. The excess polyimide is then etched away from the substrate in order to re-expose the contacts, 11. The result of the polyimide etching step is an over-etching of the polyimide in the trench to the level of the recessed contacts which is below the level of the surrounding substrate. The resulting steps, 19, between the substrate and the polyimide at the trench peripheries present difficulties in achieving unbroken metallization line patterns in subsequent processing steps.

The present invention proposes a series of method steps and the resulting structures which alleviate both the insufficient passivation and the non-planarity problems associated with the isolation trench structures of the prior art.

Figure 2A:
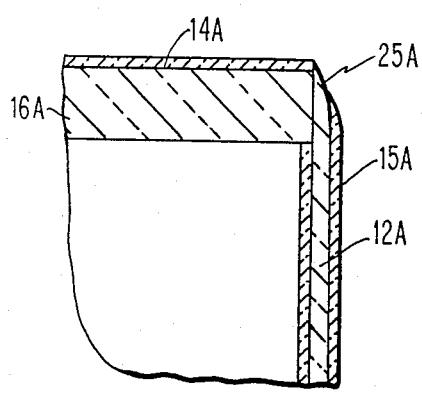
FIGS. 2A and 2B illustrate a cross-sectional view of an isolation trench periphery produced under (A) the old and (B) the new methods.
Figure 2B:
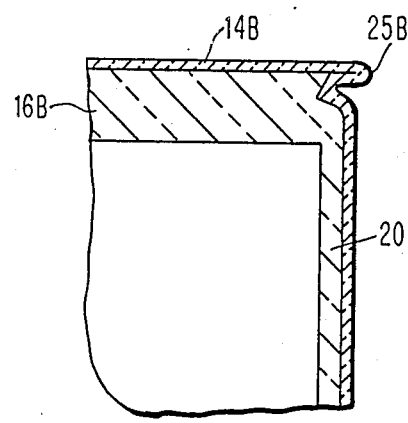

FIG. 2A is an illustration of the poorly passivated trench periphery, 25A, resulting from well known processing steps. FIG. 2B illustrates, the inventive structural solution arrived at by utilizing the subject inventive method. There can be seen, in FIG. 2B, a continuous layer of silicon nitride, 14B, at the dielectric isolation trench periphery, 25B. The teachings that follow, with reference to FIGS. 3-6, describe the invention as it arrives at the solution illustrated in FIG. 2B. The invention is described with reference to the preferred embodiment and should not be read to exclude appropriate alternative materials or processes. The invention lies in the process steps, and structure therefrom, directly related to the formation of the isolation trenches themselves; and, does not include the steps related to the preparation of the substrate or the formation of the integrated circuit structure therein in arriving at the structure found in FIG. 3A. The invention also does not include the personalization processes subsequent to the deposition and etching of nitride layer 29 of FIG. 9.

Figure 3A:
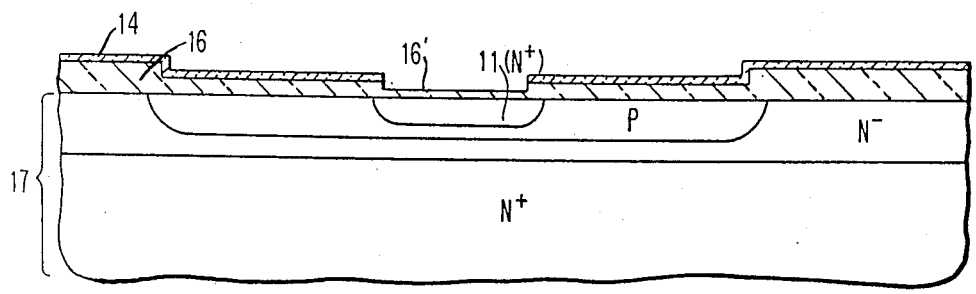
FIGS. 3A and 3B are cross-sectional views of the semiconductor substrate prior to applying the subject method.
Figure 3B:
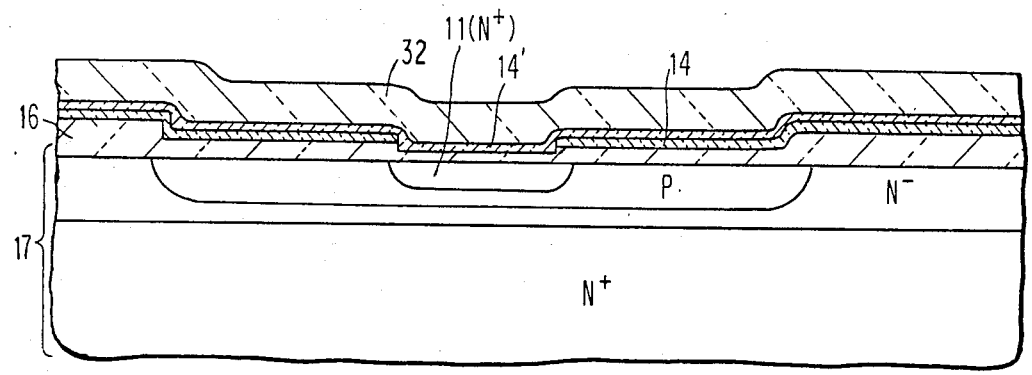
Figure 4A:
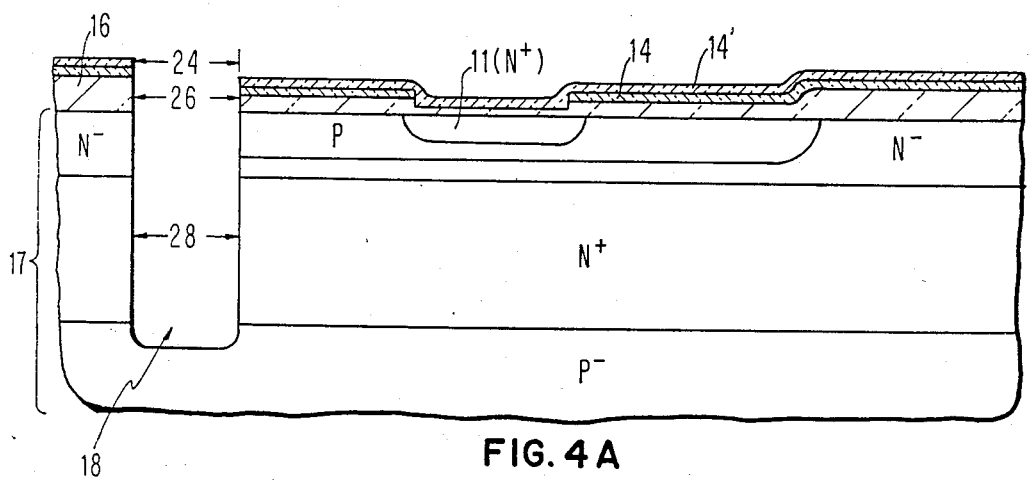
FIGS. 4A, 4B and 4C are cross-sectional views of an isolation trench illustrating the etching steps necessary to achieve the subject invention.

FIG. 3A shows a substrate, 17, having an integrated circuit structure formed therein. A layer, 16, of silicon dioxide has been deposited over the substrate and a passivating layer, 14, of silicon nitride deposited over that silicon dioxide layer in accordance with teachings well-known in the art. Layer 16' depicts an oxide layer which has been grown thermally in the emitter contact region, 11, during drive-in of the N+emitter. As shown in FIG. 3B, a silicon nitride layer 14' is deposited, preferably through low pressure chemical vapor deposition. This is followed by plasma-aided chemical vapor deposition of a thick oxide layer, 32. A trench, 18, needed for dielectric isolation is formed, as illustrated in FIG. 4, by photolithographically etching the oxide layer, 32 and then using the patterned oxide as a mask for etching the silicon nitride layers 14 and 14', silicon dioxide layer, 16, and the silicon substrate. A multi-layer resist mask, bearing the pattern desired for the isolation scheme and for the isolation contact regions, is formed over the prepared substrate and the oxide 32 is etched using reactive ion etching through the mask. The silicon nitride, 14 and 14', and silicon dioxide, 16, layers can be etched by $CF_4$, for example, and the silicon by an $SF_6$ reactive ion etchant. The results, as shown in FIG. 4A, are a hole with an opening 24 in silicon nitride layers 14 and 14', a hole with an opening 26 of identical lateral dimensions in silicon dioxide layer 16; and the trench, 18, having the same lateral dimensions, defined by opening 28, as found at 24 and 26 and having substantially vertical sidewalls extending from the bottom of the silicon dioxide layer 16 well into the silicon substrate 17. The particular etchants used and the steps for controlling the width, depth and shape of the trench are variables well-known in the art and can be selected in response to the specific needs of the ultimate endproduct.

Figure 4B:
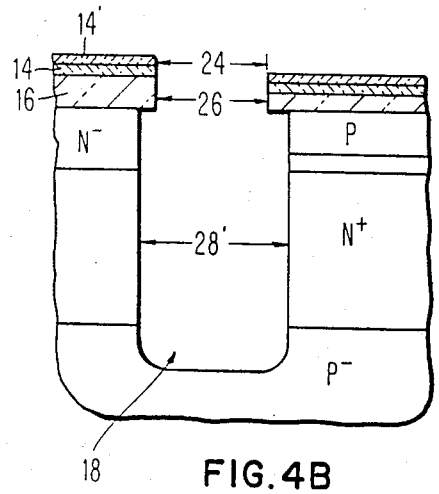
Figure 4C:
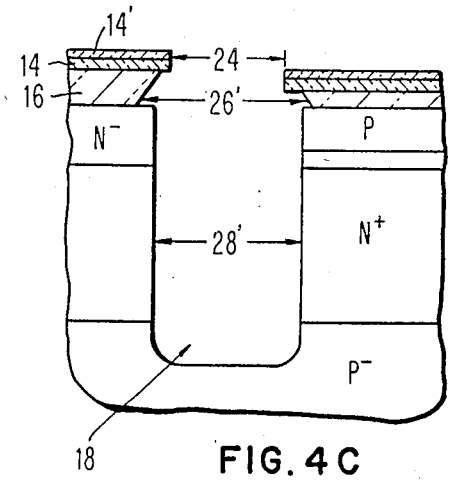
Figure 5:
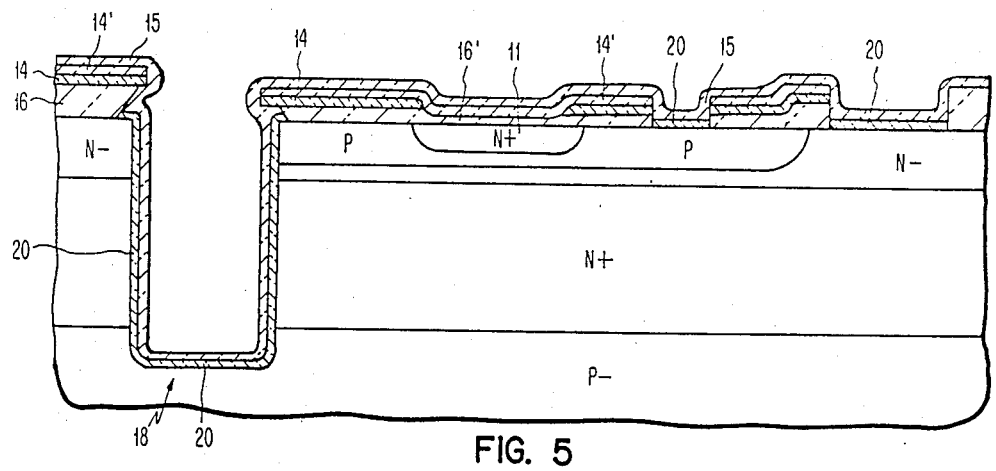
FIGS. 5, 6, 7, 8 and 9 are cross-sectional views illustrating process steps and the resulting structures in accordance with the subject invention.
Figure 6:
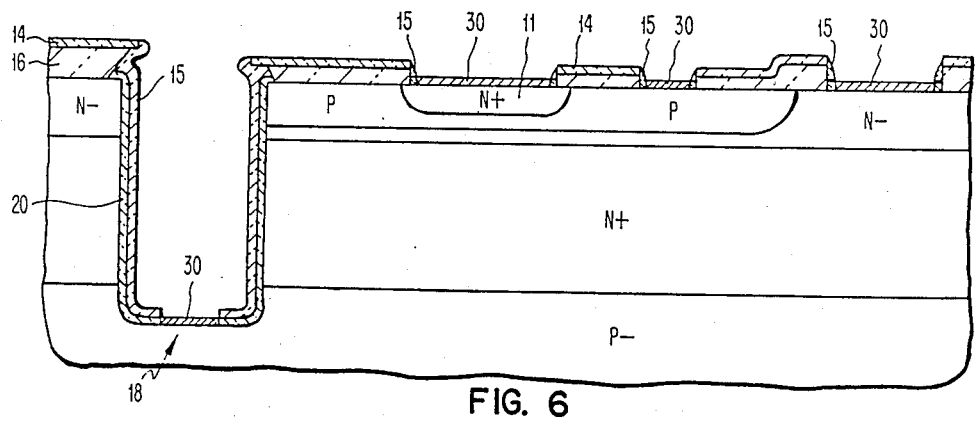

Rather than proceed to passivate and fill the trenches at this point, as would be done in the old art, the subject inventive method introduces several additional steps to alleviate the problems discussed above. First, a selective anisotropic etchant, pyrocatechol for example, is used to laterally etch only the silicon of substrate 17 and thereby expand the sidewalls of trench 18. As seen in FIG. 4A, the trench, 18, has an opening 28 which has lateral dimensions corresponding to those of openings 24 and 26. FIG. 4B illustrates the lateral expansion to 28' such that the trench sidewalls are now recessed by approximately 2000 Å) relative to the silicon nitride, 14 and 14', and silicon dioxide, 16, layers. A further etching step is then performed using a selective isotropic etchant, such as buffered HF acid, to etch only the silicon dioxide layer 16. The isotropic etchant etches in "all" directions. The result achieved, as illustrated in FIG. 4C, is an expansion of opening 26 to 26' (also by approximately 2000 Å,) leaving the layer, 16, of silicon dioxide recessed or undercut, relative to the silicon nitride layers, 14 and 14' above. The p-contacts may now be formed in accordance with well known procedures. A layer of silicon dioxide, 20, is then formed at all exposed silicon surfaces by thermal oxidation, illustrated in FIG. 5. The entire surface is next coated with a passivation layer, 15, of silicon nitride. This is followed by reactive ion etching of silicon nitride layers 15 and 14' using, for example, $CF_4$, and reactive ion etching of newly exposed oxide layers 16' and 20 using, for example, $CHF_3$. These reactive ion etching steps re-expose all contact regions and the bottom of the trenches. Platinum silicide, 30, is next formed at exposed silicon surfaces, in accordance with techniques known in the art, as illustrated at FIG. 6. As shown in FIG. 6, the silicon nitride layers 14 and 15 together form a continuous nitride passivation at the trench peripheries and over the entire semiconductor substrate in all non-contact regions.

Figure 7:
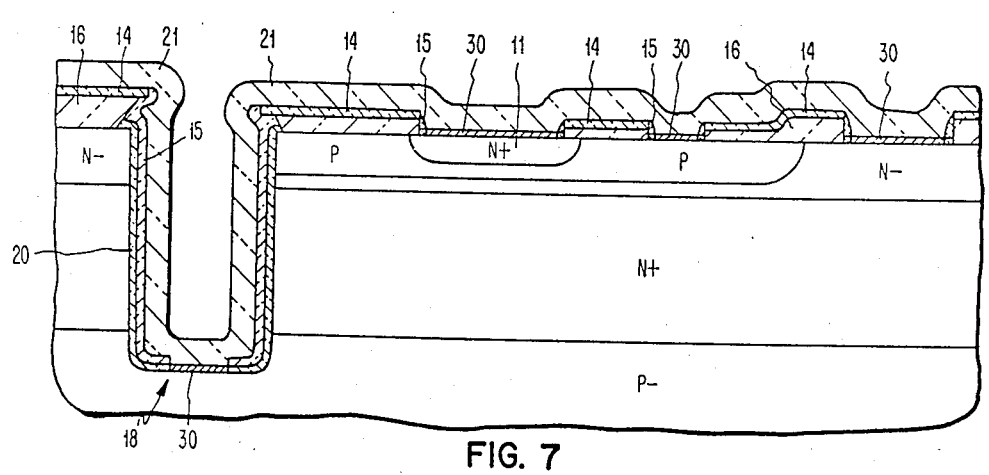
Figure 8:
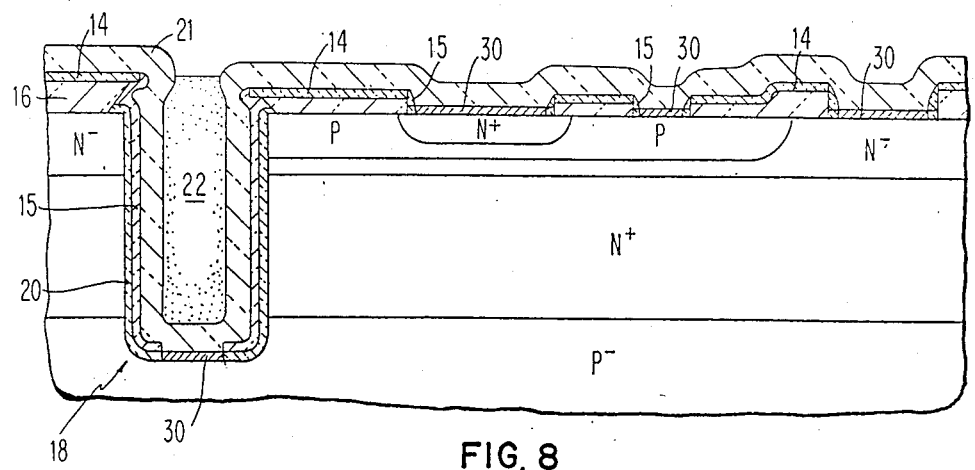
Figure 9:
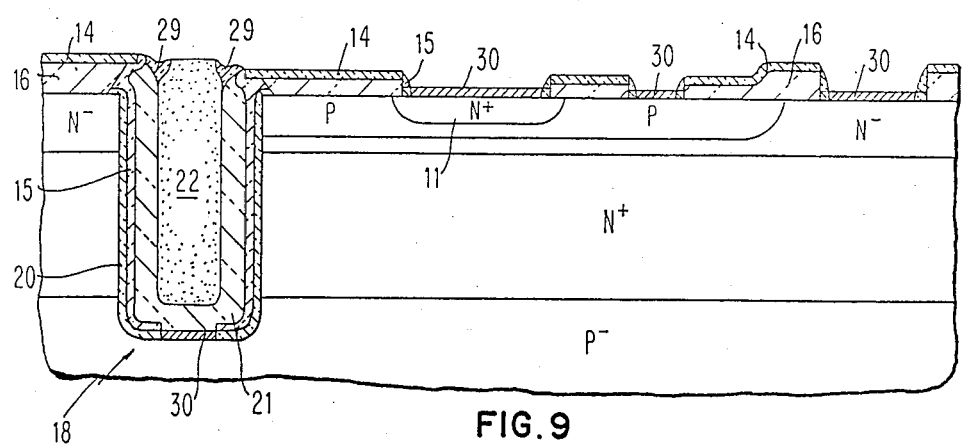
Figure 10:
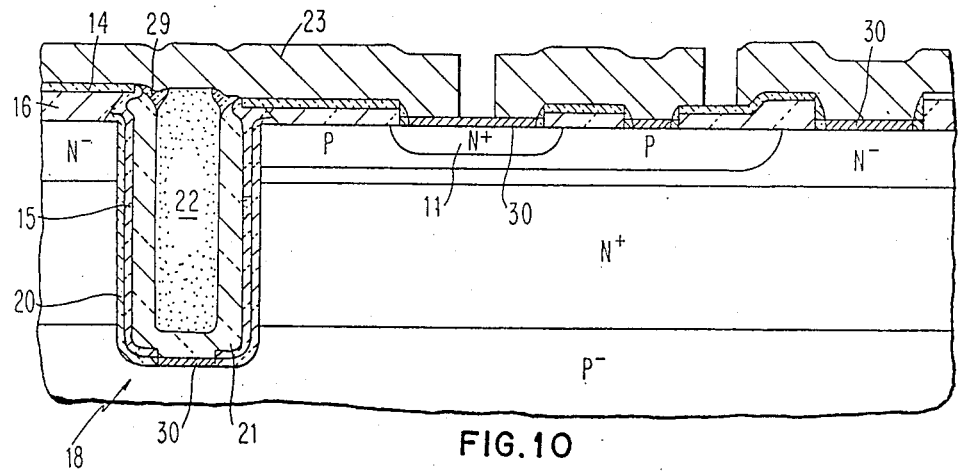
FIG. 10 is a cross-sectional view of the inventive structure undergoing further processing.

If the trench is filled with a dielectric, specifically polyimide, at this stage of processing, the etch back to expose the platinum silicide, 30, for contacts, 11, will overetch the polyimide from the level of the upper surface of nitride layer 14 on the coated substrate down to the level of the recessed platinum silicide in the contact regions and yield a large step as illustrated in FIG. 1. As a means for alleviating this large step, a relatively thick layer, 21, of silicon dioxide is conformally deposited over the entire surface of the substrate, as shown in FIG. 7, using, for example, low pressure chemical vapor deposition. The thickness of the silicon dioxide layer, 21, is controlled such that the level of the upper surface, level 31, of the layer in the contact, 11, region is above the upper surface of layer 14 in the non-contact, non-trench region (i.e. above the uppermost surface of the coated substrate field). The level of the silicon dioxide layer, 21, in the contact region is the level at which the subsequent polyimide etchback will stop. Polyimide, 22, is then deposited so as to overfill the trench, leaving an excess layer of polyimide on the silicon dioxide layer, 21, in the non-trench regions. The excess polyimide is then etched away, using a standard selective etchant, to the etch end-point, level 31, of the upper surface of silicon dioxide layer, 21, in the contact region, see FIG. 8. The silicon dioxide layer, 21, is next removed in all of the non-trench regions using vertically directional reactive ion etch, such as a $CHF_3$ reactive ion etch, in order to expose the platinum silicide, 30, in the non-trench contact regions. The result, as seen in FIG. 9, is a substantially planar semiconductor configuration having a polyimide filled isolation trench. The silicon dioxide, 21, in the trench is not affected by the etching step other than a slight etch at the top of the trench. The presence of the silicon dioxide, 21, in the trench also does not affect the trench isolation characteristics. A final layer, 29, of silicon nitride may be deposited and etched through reactive ion etching leaving only a small layer on the trench peripheries contributing further to both the passivation and planarity of the configuration. As illustrated, in FIG. 10, the substrate semiconductor structure is subjected to subsequent metallization/personalization, 23, processing.

While the invention has been particularly shown and described with reference to a preferred embodiment of a silicon substrate, $SiO_2$ insulating layers, $Si_3N_4$ passivating layers, platinum silicide contacts and polyimide isolation material, it will be understood by those skilled in the art that modifications in detail may be made without departing from the spirit and scope of the invention.

What is claimed is:

1. A method of forming dielectric isolation for an integrated circuit structure in a semiconductor substrate comprising the steps of:

forming at least one trench having substantially vertical sidewalls and at least one contact in said substrate by etching while using a surface layer mask with a suitable pattern;

anisotropically etching said semiconductor body to laterally expand the sidewalls of said trench and to undercut the overlying surface layer mask;

forming a first insulating layer over the surfaces of said trench;

forming a first passivating layer over the trench surfaces and over said substrate surface thereby assuring a continuous passivating layer at the undercut of said surface layer mask;

forming a second layer of insulating material uniformly over the passivating layer;

depositing a dielectric layer over said second layer of insulating material thereby filling the trench;

uniformly etching said dielectric layer to the level of said second layer of insulating material in the contact areas, thereby leaving said dielectric layer in the trench; and uniformly etching said second layer of insulating material from the substrate surface leaving said second layer only in the trench.

2. A method of forming dielectric isolation, as in claim 1, wherein said dielectric is polyimide.

3. A method of forming dielectric isolation, as in claim 1, wherein said substrate is silicon, said insulating material is silicon dioxide and said passivating material is silicon nitride.

4. A method of forming dielectric isolation, as in claim 1, wherein said surface layer mask is a patterned layer of silicon nitride deposited on said substrate.

5. A method of forming, dielectric isolation, as in claim 1, wherein said suface layer mask pattern comprises successive layers of identically patterned silicon dioxide and silicon nitride and wherein said anisotropic etching step is followed by isotropically etching said silicon dioxide layer to also undercut said silicon nitride mask layer.

6. A method of forming dielectric isolation in a semiconductor substrate having an integrated circuit structure with contact regions formed therein comprising the steps of:

forming a first layer of insulating material on the upper surface of the semiconductor substrate;

forming a first layer of passivating material over the first layer of insulating material;

forming at least one opening in said first passivating layer by etching the layer using a suitable mask pattern;

forming at least one opening by etching in said first insulating layer corresponding with said openings in first passivating layer and having the same lateral dimension as the openings in the first passivating layer;

forming at least one trench in said substrate by etching said trench having substantially vertical sidewalls to the same lateral dimensions as the openings in said first passivating layer and said first insulating layer;

anisotropically etching said substrate to expand the sidewalls of said trench such that the sidewalls are recessed from the overlying first passivating and first insulating layers;

isotropically etching said first insulating layer to undercut said passivating layer whereby the opening in said first layer of insulating material is greater than the opening in said first layer of passivating material and is substantially the same as the lateral dimensions of the expanded trench sidewalls;

forming a thin second layer of insulating material in the trench, said second layer coating all exposed trench surfaces to form a continuous layer with the undercut first layer of insulating material;

conformally forming a continuous second layer of passivating material over the first passivating layer on the upper surface of the substrate and on the first and second insulating layers on the trench surfaces;

forming a third layer of insulating material uniformly over said second layer of passivating material to a level in the contact region which is above the level of the top surface of the second passivating layer on the upper surface of the substrate;

forming a layer of dielectric material over said third layer of insulating material which overfills said trenches;

removing said dielectric layer by etching said layer back to the level of the third layer of insulating material in contact region thereby leaving the trench filled with said dielectric layer; and removing said third layer of insulating material by etching uniformly in all non-trench areas.

7. A method of forming dielectric isolation, as in claim 6, wherein said formation of a continuous second layer of passivating material is followed by the further steps of removing said second layer of passivating material and said second layer of insulating material in all horizontal directions; and, forming platinum silicide on the silicon exposed by said removal.

8. A method of forming dielectric isolation, as in claim 6 or 7, wherein said semiconductor substrate is silicon, said insulating material is silicon dioxide and said passivating material is silicon nitride.

9. A method of forming dielectric isolation, as in claim 6 or 7, wherein said dielectric material is polyimide.

10. A method of forming dielectric isolation, as in claim 8, further comprising the passivation and planarization steps of:

forming a third layer of silicon nitride over said dielectric and said third layer of silicon dioxide in the trench region and over said second layer of silicon nitride on the substrate; and removing said third silicon nitride layer from all surfaces to the level of the top of the dielectric layer and the top of the second silicon nitride layer on the upper surface of the substrate whereby the deposited third silicon dioxide layer remains below said level at the trench peripheries over the third layer of silicon dioxide.

* * * * *

UNITED STATES PATENT AND TRADEMARK OFFICE
CERTIFICATE OF CORRECTION

PATENT NO. : 4,663,832

DATED : May 12, 1987

INVENTOR(S) : C.G. JAMBOTKAR

It is certified that error appears in the above-identified patent and that said Letters Patent is hereby corrected as shown below:

Delete "pattern" in Claim 5, Col. 5, line 55.

Signed and Sealed this

Twentieth Day of October, 1987

Attest:

DONALD J. QUIGG

*Attesting Officer*　　　　*Commissioner of Patents and Trademarks*